United States Patent
Fuhrmann et al.

(10) Patent No.: US 9,299,886 B2
(45) Date of Patent: Mar. 29, 2016

(54) LED SEMICONDUCTOR COMPONENT

(71) Applicant: AZUR SPACE Solar Power GmbH, Heilbronn (DE)

(72) Inventors: Daniel Fuhrmann, Heilbronn (DE); Florian Dunzer, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 14/609,635

(22) Filed: Jan. 30, 2015

(65) Prior Publication Data
US 2015/0214427 A1    Jul. 30, 2015

(30) Foreign Application Priority Data

Jan. 30, 2014  (EP) .................................... 14000357

(51) Int. Cl.
| | |
|---|---|
| *H01L 33/00* | (2010.01) |
| *H01L 33/06* | (2010.01) |
| *H01L 33/30* | (2010.01) |
| *H01L 33/02* | (2010.01) |
| *H01L 33/14* | (2010.01) |
| *H01L 33/40* | (2010.01) |

(52) U.S. Cl.
CPC .............. *H01L 33/06* (2013.01); *H01L 33/025* (2013.01); *H01L 33/14* (2013.01); *H01L 33/30* (2013.01); *H01L 33/40* (2013.01)

(58) Field of Classification Search
CPC ..... H01L 33/06; H01L 33/0025; H01L 33/30; H01L 33/0008; H01L 33/14; H01L 33/025
See application file for complete search history.

(56) References Cited

U.S. PATENT DOCUMENTS

| | | | |
|---|---|---|---|
| 4,590,501 A | 5/1986 | Scholl | |
| 5,814,838 A * | 9/1998 | Ohtsuka et al. | ................. 257/94 |
| 6,278,139 B1 | 8/2001 | Ishikawa et al. | |
| 6,869,820 B2 | 3/2005 | Chen | |

(Continued)

FOREIGN PATENT DOCUMENTS

| | | |
|---|---|---|
| DE | 102 53 160 A1 | 3/2004 |
| DE | 10 2007 057 674 A1 | 6/2009 |

(Continued)

OTHER PUBLICATIONS

Yu et al., "MOCVD growth of strain-compensated multi-quantum wells light emitting diode," Vacuum, vol. 69, pp. 489-493 (2003).

(Continued)

*Primary Examiner* — Nikolay Yushin
(74) *Attorney, Agent, or Firm* — Muncy, Geissler, Olds & Lowe, P.C.

(57) ABSTRACT

An LED semiconductor component having an n-doped substrate layer and a first, n-doped cladding layer, wherein the cladding layer is located on the substrate layer, and having an active layer, wherein the active layer comprises a light-emitting layer and is located on the first cladding layer, and having a second, p-doped cladding layer, wherein the second cladding layer is located on the active layer, and having a p-doped current spreading layer, wherein the current spreading layer is located on the second cladding layer, and having a p-doped contact layer, wherein the p-doped contact layer is located on the current spreading layer, wherein the p-doped contact layer is made of an aluminiferous layer and has carbon as dopant.

10 Claims, 1 Drawing Sheet

(56) References Cited

U.S. PATENT DOCUMENTS

| | | |
|---|---|---|
| 7,151,307 B2 | 12/2006 | Boutros et al. |
| 7,528,485 B2 * | 5/2009 | Morita et al. ............... 257/735 |
| 8,330,174 B2 | 12/2012 | Sabathil et al. |
| 2004/0227142 A1 * | 11/2004 | Izumiya ..................... 257/79 |
| 2007/0075327 A1 | 4/2007 | Arai et al. |
| 2013/0126920 A1 | 5/2013 | Sundgren et al. |

FOREIGN PATENT DOCUMENTS

| | | |
|---|---|---|
| DE | 10 2010 014 667 A1 | 10/2011 |
| DE | 102 11 531 B4 | 12/2012 |
| EP | 0 987 770 A1 | 3/2000 |
| JP | H 08-204234 A | 8/1996 |
| JP | H 11-233815 A | 8/1999 |
| JP | 2000-101133 A | 4/2000 |
| JP | 2004-207549 A | 7/2004 |

OTHER PUBLICATIONS

D'Hondt et al., "High quality InGaAs/AlGaAs lasers grown on Ge substrates," J. of Crystal Growth, vol. 195, pp. 655-659 (1998).

Jifang et al., "Influence of growth temperatures on the quality of InGaAs/GaAs quantum well structure growth on Ge substrate by molecular beam epitaxy," J. of Semiconductors, vol. 32, No. 4, pp. 043004-1-043004-5 (Apr. 2011).

* cited by examiner

LED SEMICONDUCTOR COMPONENT

This nonprovisional application claims priority to European Patent Application No. 14000357.5, which was filed on Jan. 30, 2014, and which is herein incorporated by reference.

BACKGROUND OF THE INVENTION

1. Field of the Invention

The present invention relates to an LED semiconductor component.

2. Description of the Background Art

LED semiconductor components are known from DE 10 2007 057 674 A1 (which corresponds to U.S. Pat. No. 8,330,174), DE 102 11 531 B4 (which corresponds to U.S. Pat. No. 6,869,820), U.S. Pat. No. 8,330,174 B2, and U.S. Pat. No. 7,151,307. In addition, further LED structures are known from Y. Yu et al., Vacuum 69 (2003), pp. 489-493, from M. D'Hondt et al., Journal of Crystal Growth 195 (1998), pp. 655-639, and from H. Jifang et al., Journal of Semiconductors 2011, 32 (4).

SUMMARY OF THE INVENTION

It is therefore an object of the present invention to provide a device that advances the state of the art.

According to an embodiment of the invention, an LED semiconductor component is provided, having an n-doped substrate layer and a first, n-doped cladding layer, wherein the cladding layer is located on the substrate layer, and having an active layer, wherein the active layer comprises a light-emitting layer and is located on the first cladding layer, and having a second, p-doped cladding layer, wherein the second cladding layer is located on the active layer, and having a p-doped current spreading layer, wherein the current spreading layer is located on the second cladding layer, and having a p-doped contact layer, wherein the p-doped contact layer is located on the current spreading layer, wherein the p-doped contact layer is made of an aluminiferous layer and has carbon as dopant. For a commercial LED, the abovementioned layer structure can be encased and provided with electrical terminals. It should further be noted that, surprisingly, increasing the aluminum content of the topmost layer also makes it possible to increase the carbon doping, and in so doing to improve the component properties.

It is an advantage of the device according to the invention that, as a result of the design according to the invention, the luminous efficacy increases and the forward voltage of the LED drops. This increases efficiency and simplifies manufacture. Moreover, production costs are reduced.

In an embodiment, the concentration of aluminum is higher in the contact layer than in the current spreading layer. Preferably the contact layer is made of $Al_xGa_{1-x}As$ and has an aluminum content of $x>0.1$ here.

In an embodiment, the carbon concentration of the contact layer can be greater than $2.5 \times 10^{19}$. Investigations have shown that a thickness of the contact layer less than 100 nm is sufficient. The design according to the invention can be used to particular advantage when the cladding layers and current spreading layer located on the substrate layer each include an AlGaAs compound. It is especially advantageous when the substrate layer includes germanium or GaAs, or is made of GaAs or germanium. It is a matter of course that the substrate layer is doped in each case. Preferably, the substrate layer is n-doped.

In an embodiment, the light-emitting layer can be designed such that light in the infrared spectral region is emitted by the layer. Preferably the layer emits light in the spectral region between 750 nm and 1000 nm. Investigations have shown that it is especially advantageous when the light-emitting layer includes a multiple quantum well structure. In particular, the multiple quantum well structure includes a combination of GaAs and/or AlGaAs and/or InGaAs and/or GaAsP and/or InGaAsP and/or InAlGaAs. Furthermore, it should be noted that the current spreading layer has a different chemical composition from the second cladding layer. Under no circumstances can the two layers be formed as a single homogeneous layer. Preferably, the current spreading layer also has a different layer thickness from the second cladding layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
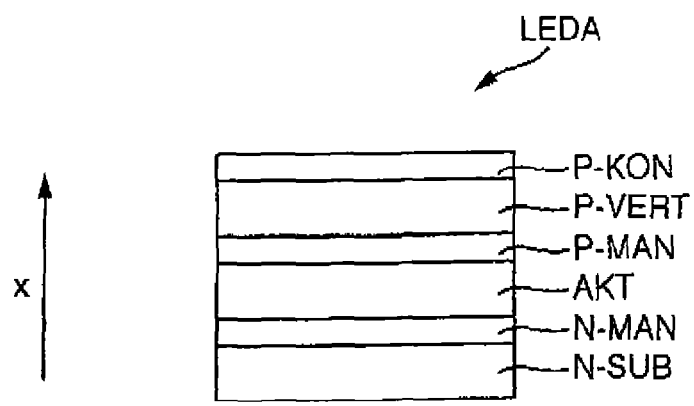
FIG. 1 shows a cross-section of a layer structure.

The illustration in FIG. 1 shows a cross-section of a layer structure of an LED semiconductor component LEDA with an n-doped substrate layer N-SUB, wherein the substrate layer N-SUB includes a germanium or GaAs compound. Formed on the n-doped substrate layer N-SUB is an n-doped cladding layer N-MAN, wherein the cladding layer N-MAN is, in particular, integrally arranged on the substrate layer N-SUB. An active layer AKT is formed on the cladding layer N-MAN, wherein the active layer comprises a light-emitting layer and preferably is integrally arranged on the first cladding layer N-MAN. The light-emitting layer comprises a multiple quantum well structure, which is not shown. Formed on the active layer AKT is a second, p-doped cladding layer P-MAN, wherein the second, p-doped cladding layer P-MAN is integrally joined to the active layer AKT. A p-doped current spreading layer P-VERT is located on the second cladding layer P-MAN, wherein the current spreading layer P-VERT is integrally joined to the second cladding layer P-MAN. Arranged on the current spreading layer P-VERT is a p-doped contact layer P-KON, wherein the p-doped contact layer P-KON is integrally joined to the current spreading layer P-VERT. In this design, the p-doped contact layer P-KON has an aluminiferous layer and has carbon as dopant.

Figure 2:
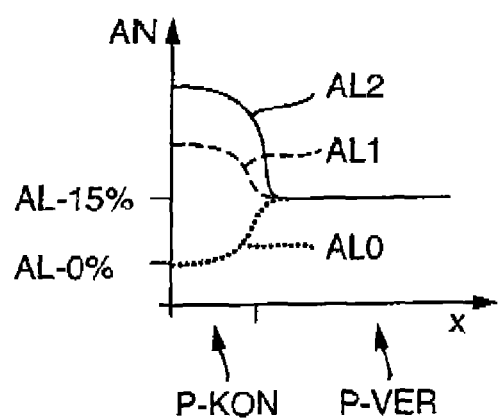
FIG. 2 shows a curve of an aluminum concentration in the two topmost layers of the layer structure shown in FIG. 1.

The illustration in FIG. 2 shows example curves of aluminum concentrations AN in the two uppermost layers, which is to say the contact layer P-KON and the current spreading layer P-VERT, of the layer structure shown in FIG. 1. Only the differences from the illustration in FIG. 1 are explained below. The curve of the aluminum concentration AN according to the prior art is represented by way of example with a dotted curve AL0. It is apparent that, starting from a concentration of 15% in the current spreading layer P-VERT, the aluminum concentration AN rapidly falls below the detection limit. For reasons of clarity, the detection limit is represented as 0%. In comparison, according to a dashed curve AL1, the aluminum concentration AN rises to values above 15% in the contact layer P-KON according to the invention. In another embodiment shown, according to a solid-line curve AL2 the aluminum concentration AN in the contact layer P-KON rises even more sharply than in the curve AL1.

Figure 3:
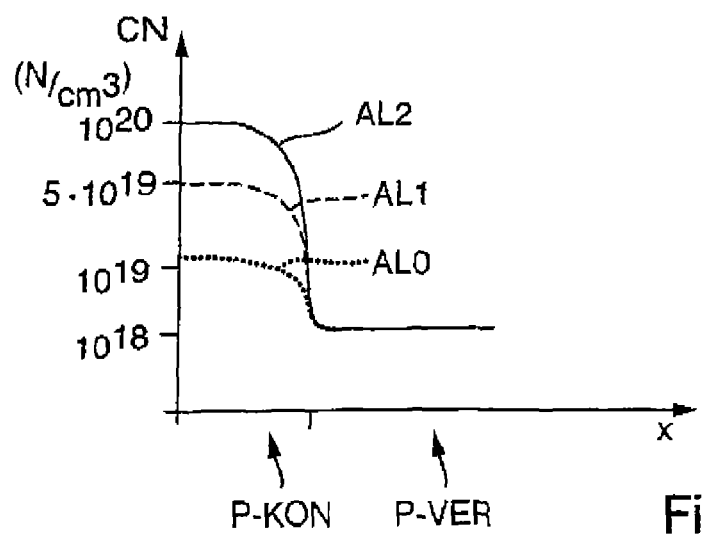
FIG. 3 shows a curve of the dopant concentration in the two topmost layers of the layer structure shown in FIG. 1.

The illustration in FIG. 3 shows example curves of dopant concentrations CN in the two uppermost layers, which is to say for the contact layer P-KON and the current spreading layer P-VERT, of the layer structure shown in FIG. 1. Only the differences from the illustrations in FIG. 1 and FIG. 2 are explained below. The dopant concentration CN according to the prior art is shown by way of example for the curve AL0 in a dotted curve. It is apparent that, starting from a concentration of approximately $10^{18}$ N/cm$^3$ in the current spreading layer P-VERT, the dopant concentration CN rapidly rises to values just above $10^{19}$ N/cm$^3$. In comparison, according to the dashed curve AL1, the dopant concentration CN rises to values above the values of the prior art in the contact layer P-KON according to the invention, wherein preferably values of approximately $5\times10^{19}$ N/cm$^3$ are reached. In another embodiment shown, according to the solid-line curve AL2, the dopant concentration CN in the contact layer P-KON rises even more sharply than in the curve AL1, wherein preferably values up to approximately $2\times10^{20}$ N/cm$^3$ are reached. It should be noted that in contrast to the prior art, C, which is to say carbon, is used instead of Zn as dopant in the present case.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An LED semiconductor component comprising: an n-doped substrate layer; a first n-doped cladding layer located on the n-doped substrate layer; an active layer comprising a light-emitting layer and being located on the first n-doped cladding layer; a second p-doped cladding layer located on the active layer; a p-doped current spreading layer disposed directly on the second p-doped cladding layer; and a p-doped contact layer located on the p-doped current spreading layer, the p-doped contact layer being made of an aluminiferous layer and has carbon as a dopant, wherein a concentration of aluminum is higher in the p-doped contact layer than in the p-doped current spreading layer, and wherein the first n-doped and second p-doped cladding layers and current spreading layer located on the substrate layer each include an AlGaAs compound.

2. The LED semiconductor component according to claim 1, wherein the contact layer is made of $Al_xGa_{1-x}As$ and has an aluminum content of x>0.1.

3. The LED semiconductor component according to claim 1, wherein a carbon concentration of the contact layer is greater than $2.5\times10^{19}$.

4. The LED semiconductor component according to claim 1, wherein a thickness of the contact layer is less than 100 nm.

5. The LED semiconductor component according to claim 1, wherein the n-doped substrate layer includes germanium or gallium arsenide.

6. The LED semiconductor component according to claim 1, wherein the light-emitting layer emits light in an infrared spectral region.

7. The LED semiconductor component according to claim 1, wherein the light-emitting layer emits light in a spectral region between 750 nm and 1000 nm.

8. The LED semiconductor component according to claim 1, wherein the light-emitting layer includes a multiple quantum well structure.

9. The LED semiconductor component according to claim 8, wherein the multiple quantum well structure includes a GaAs and/or AlGaAs and/or InGaAs and/or GaAsP and/or InGaAsP and/or InAlGaAs compound.

10. The LED semiconductor component according to claim 1, wherein the p-doped current spreading layer has a different chemical composition from the p-doped second cladding layer.

* * * * *